United States Patent
Yen (10) Patent No.: US 9,543,986 B2
(45) Date of Patent: Jan. 10, 2017

(54) COMMUNICATION DEVICE FOR UPLINK TRANSMISSION WITH ENCODED INFORMATION BITS AND METHOD THEREOF

(71) Applicant: Industrial Technology Research Institute, Hsinchu County (TW)

(72) Inventor: Chia-Pang Yen, New Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 182 days.

(21) Appl. No.: 13/957,151

(22) Filed: Aug. 1, 2013

(65) Prior Publication Data

US 2014/0040705 A1 Feb. 6, 2014

Related U.S. Application Data

(60) Provisional application No. 61/680,258, filed on Aug. 6, 2012.

(51) Int. Cl.
*H03M 13/13* (2006.01)
*H04L 1/00* (2006.01)
(Continued)

(52) U.S. Cl.
CPC ............ *H03M 13/136* (2013.01); *H04L 1/007* (2013.01); *H04L 1/0057* (2013.01); *H04L 1/0068* (2013.01);
(Continued)

(58) Field of Classification Search
CPC ...... H04L 1/0057; H04L 1/0068; H04L 1/007; H04L 1/1671; H04L 1/1812; H03M 13/136; H03M 13/151; H03M 13/1515; H03M 13/155; H04B 7/0636; H04B 7/0652; H04B 7/0656
(Continued)

(56) References Cited

U.S. PATENT DOCUMENTS

2010/0272209 A1 10/2010 Lee
2011/0228863 A1 9/2011 Papasakellariou
(Continued)

FOREIGN PATENT DOCUMENTS

CN 102394725 A 3/2012

OTHER PUBLICATIONS

HTC, ITRI, Multiplexing of CSI reports for DL CoMP, 3GPP TSG-RAN #70, Aug. 5, 2012.

*Primary Examiner* — Albert Decady
*Assistant Examiner* — Christian Dorman
(74) *Attorney, Agent, or Firm* — Winston Hsu; Scott Margo (57) ABSTRACT

A communication device for uplink transmission with a first type of information and a second type of information includes a demultiplexing circuit, a vector selection circuit, a permutation circuit and a Reed-Muller encoding circuit. The demultiplexing circuit generates a first group of information bits and a second group of information bits according to the first type of information and the second type of information. The vector selection circuit selects code vectors from a predetermined vector set for the first group of information bits and the second group of information bits. The permutation circuit permutes the code vectors according to the first group of information bits and according to the second group of information bits. The Reed-Muller encoding circuit encodes the first group of information bits and the second group of information bits with the permuted code vectors for providing different levels of protection.

20 Claims, 4 Drawing Sheets

(51) Int. Cl.
*H04L 1/16* (2006.01)
*H04L 1/18* (2006.01)
*H03M 13/15* (2006.01)
*H04B 7/06* (2006.01)

(52) U.S. Cl.
CPC ........... *H04L 1/1671* (2013.01); *H04L 1/1812* (2013.01); *H03M 13/151* (2013.01); *H03M 13/155* (2013.01); *H03M 13/1515* (2013.01); *H04B 7/0636* (2013.01); *H04B 7/0652* (2013.01); *H04B 7/0656* (2013.01)

(58) Field of Classification Search
USPC ................. 714/748, 751, 752, 776, 781–785
See application file for complete search history.

(56) References Cited

U.S. PATENT DOCUMENTS

2011/0239076 A1    9/2011  Liu et al.
2011/0268090 A1*  11/2011  Qu et al. ................... 370/335
2014/0233523 A1*   8/2014  Jang et al. ................ 370/329

\* cited by examiner

COMMUNICATION DEVICE FOR UPLINK TRANSMISSION WITH ENCODED INFORMATION BITS AND METHOD THEREOF

CROSS-REFERENCE TO RELATED APPLICATIONS

This application claims the benefit of priority to U.S. Provisional Application Ser. No. 61/680,258, filed on Aug. 6, 2012; the entirety of which is incorporated herein by reference for all purposes.

BACKGROUND

The disclosure generally relates to a user equipment and, more particularly, to the uplink communications of encoded information bits of the user equipment.

Mobile communications have brought people so many conveniences and become indispensable in modern times. People are getting used to handling more and more tasks on the mobile communication devices, e.g., surfing the Internet, watching videos, and telephone conversations. In response to the increasing demand for faster mobile communications, many techniques have been proposed to improve the data rate of the mobile communications. For example, the carrier aggregation technique may be used to aggregate the bandwidth of multiple component carriers for increasing the communication data rates. Moreover, the channel state information (CSI) of the component carriers may be effectively utilized to adapt the communications to the channel conditions, and is crucial for achieving high data rate communications.

In the LTE and the future standards, the reporting of the CSI may frequently collide with the reporting of the acknowledgement information. In the earlier releases of the standards, the CSI is dropped when colliding with the acknowledgement information. Accordingly, the network may not timely receive the CSI for adjusting the communication parameters and the system performance might be affected. In the later releases, the simultaneous transmission of the multi-carrier acknowledgement information and the multi-carrier CSI is supported by using the PUCCH (physical uplink control channel) format 3 packets.

The error rate requirements for transmitting the acknowledgement information, the CSI and other information may be different. For example, the bit error rate (BER) requirement of the acknowledgement information (BER<=0.01) is higher than the BER of the CSI (BER<=0.1). To ensure the correct decoding of all the information, unnecessary transmission power and computation complexity are wasted on the information with lower error rate requirement (e.g., the CSI). Otherwise, the acknowledgement information or other important information may not be correctly decoded and the system performance may be seriously affected.

SUMMARY

In view of the foregoing, it may be appreciated that a substantial need exists for methods and apparatuses that mitigate or reduce the problems above.

An example embodiment of a communication device for uplink transmission with a first type of information and a second type of information is disclosed, comprising: a demultiplexing circuit, configured to operably generate a first group of information bits and a second group of information bits according to the first type of information and the second type of information, wherein the first group of information bits comprises n11 bit(s) of the first type of information and n12 bit(s) of the second type of information; the second group of information bits comprises n21 bit(s) of the first type of information and n21 bit(s) of the second type of information; a vector selection circuit, configured to operably select (n11+n12) code vectors from a predetermined vector set, and select (n21+n22) code vectors from the predetermined vector set; a permutation circuit, configured to operably permute the (n11+n12) code vectors according to the n11 bit(s) and the n12 bit(s) of the first group of information bits, and permute the (n21+n22) code vectors according to the n21 bit(s) and the n22 bit(s) of the second group of information bits; and a Reed-Muller encoding circuit, configured to operably encode the first group of information bits with the permuted (n11+n12) code vectors, and encode the second group of information bits with the permuted (n21+n22) code vectors; wherein an error rate requirement of the first type of information is higher than an error rate requirement of the second type of information.

Another example embodiment of a communication device for uplink transmission with a first type of information and a second type of information is disclosed, comprising: a demultiplexing circuit, configured to operably generate a first group of information bits and a second group of information bits according to the first type of information and the second type of information, wherein the first group of information bits comprises n11 bit(s) of the first type of information and n12 bit(s) of the second type of information; the second group of information bits comprises n21 bit(s) of the first type of information and n21 bit(s) of the second type of information; a vector selection circuit, configured to operably select (n11+n12) code vectors from a predetermined vector set, and select (n21+n22) code vectors from the predetermined vector set; a permutation circuit, configured to operably permute the n11 bit(s) and the n12 bit(s) of the first group of information bits according to the selected (n11+n12) code vectors, and permute the n21 bit(s) and n22 bit(s) of the second group of information bits according to the selected (n21+n22) code vectors; and a Reed-Muller encoding circuit, configured to operably encode the permuted first group of information bits with the (n11+n12) code vectors, and encode the permuted second group of information bits with the (n21+n22) code vectors; wherein an error rate requirement of the first type of information is higher than an error rate requirement of the second type of information.

Another example embodiment of a method for uplink transmission with a first type of information and a second type of information is disclosed, comprising: generating a first group of information bits and a second group of information bits according to the first type of information and the second type of information, wherein the first group of information bits comprises n11 bit(s) of the first type of information and n12 bit(s) of the second type of information; the second group of information bits comprises n21 bit(s) of the first type of information and n21 bit(s) of the second type of information; selecting (n11+n12) code vectors from a predetermined vector set, and selecting (n21+n22) code vectors from the predetermined vector set; permuting the (n11+n12) code vectors according to the n11 bit(s) and the n12 bit(s) of the first group of information bits, and permuting the (n21+n22) code vectors according to the n21 bit(s) and the n22 bit(s) of the second group of information bits; and encoding the first group of information bits with the permuted (n11+n12) code vectors, and encoding the second group of information bits with the permuted (n21+n22) code vectors; wherein an error rate requirement of the first type of information is higher than an error rate requirement of the second type of information.

Another example embodiment of a method for uplink transmission with a first type of information and a second type of information is disclosed, comprising: generating a first group of information bits and a second group of information bits according to the first type of information and the second type of information, wherein the first group of information bits comprises n11 bit(s) of the first type of information and n12 bit(s) of the second type of information; the second group of information bits comprises n21 bit(s) of the first type of information and n21 bit(s) of the second type of information; selecting (n11+n12) code vectors from a predetermined vector set, and selecting (n21+n22) code vectors from the predetermined vector set; permuting the n11 bit(s) and the n12 bit(s) of the first group of information bits according to the selected (n11+n12) code vectors, and permuting the n21 bit(s) and n22 bit(s) of the second group of information bits according to the selected (n21+n22) code vectors; and encoding the permuted first group of information bits with the (n11+n12) code vectors, and encoding the permuted second group of information bits with the (n21+n22) code vectors; wherein an error rate requirement of the first type of information is higher than an error rate requirement of the second type of information.

Both the foregoing general description and the following detailed description are examples and explanatory only, and are not restrictive of the invention as claimed.

DETAILED DESCRIPTION

Reference is made in detail to embodiments of the invention, which are illustrated in the accompanying drawings. The same reference numbers may be used throughout the drawings to refer to the same or like parts, components, or operations.

In the present disclosure, the Third Generation Partnership Project (3GPP) Long Term Evolution (LTE) architectures are used as embodiments. The present disclosure, however, is not limited to the 3GPP LTE architectures and other communication systems may also be utilized in employing the embodiments provided herein.

When receiving a signal from the network, a user equipment (UE) may be required to provide the network with an acknowledgement information to acknowledge or negatively acknowledge receipt of a packet in the uplink transmission. For example, an acknowledgement (ACK) indicates a packet is successfully received and decoded, and a negative acknowledgement (NACK) indicates the packet previously sent was not successfully decoded.

The UE may also be required to periodically send the channel state information (CSI) to the network to indicate the status of the channel. For example, the CSI may comprise a rank indicator (RI), a channel quality indicator (CQI), a precoder matrix indicator (PMI), etc.

In the 3GPP LTE specifications Release 11 and later releases, the UE may be configured to simultaneously transmit a Hybrid Automatic Repeat Request ACK (HARQ-ACK), other acknowledgement information, the CSI and other information (e.g., the scheduling request), etc. By utilizing the carrier aggregation technique, the UE may receive or transmit on multiple component carriers (e.g., five component carriers). Therefore, the UE is required to simultaneously transmit the multi-carrier HARQ-ACK and multi-carrier CSI by using the PUCCH format 3 packet in the uplink communications.

When the payload size N is less than 11 bits, the payload is multiplied with the code vectors selected from the RM(32, N) vector set to produce a 32-bit code word. The RM(32, N) vector set comprises the Reed-Muller code vectors with 32 rows and N columns, e.g., the Reed-Muller code disclosed in 3GPP Technical Specification 36.212. The 32-bit code word is concatenated with its last 16 bits to generate a 48-bit code word. Afterward, the 48-bit code word is further processed by interleaving, constellation mapping, discrete Fourier transformation, inverse fast Fourier transformation, etc. to produce the PUCCH format 3 packet.

Figure 1:
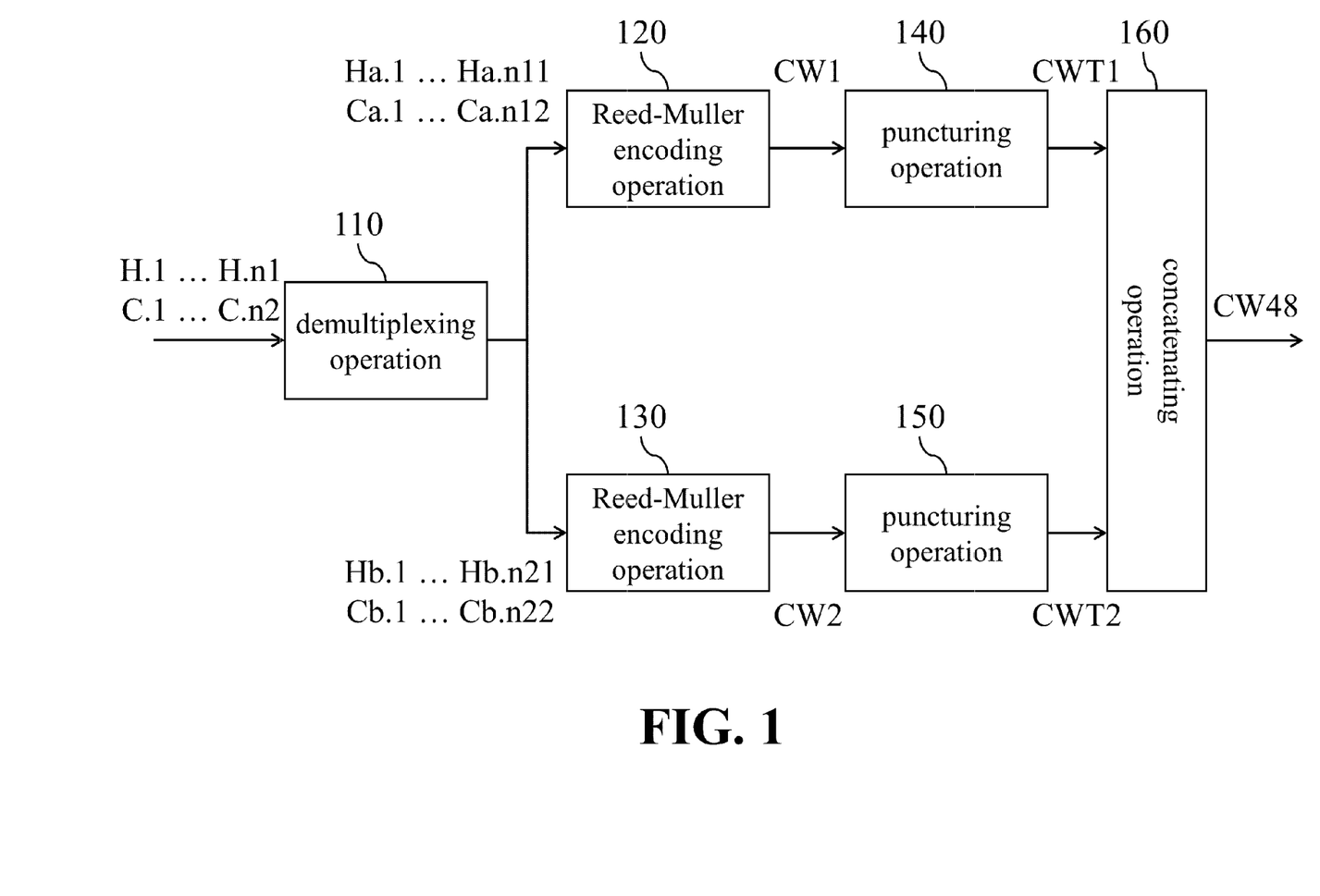
FIG. 1 shows a simplified schematic diagram of an encoding structure for encoding the payload of the uplink transmission according to one embodiment of the present disclosure.

For the payload size N between 11 bits and 21 bits, please refer to the schematic diagram in FIG. 1. FIG. 1 shows a simplified schematic diagram of an encoding structure for encoding the payload of the uplink transmission according to one embodiment of the present disclosure. For the purposes of conciseness and clear explanation, other operations and connections are not shown in FIG. 1.

In FIG. 1, the embodiment adopts a joint coding scheme. A first type of information (e.g., the HARQ-ACK bits H.1~H.n1 in this embodiment) and a second type of information (e.g., the CSI bits C.1~C.n2 in this embodiment) are demultiplexed in the block 110 to generate a first group of information bits (e.g., the HARQ-ACK bits Ha.1~Ha.n11 and the CSI bits Ca.1~Ca.n12 in this embodiment) and a second group of information bits (e.g., the HARQ-ACK bits Hb.1~Hb.n21 and the CSI bits Cb.1~Cb.n22 in this embodiment). In the above description, the notation n1, n2, n11, n12, n21 and n22 are utilized to express the idea of the joint coding, and may be configured to be any suitable value. For example, one of the first group of information bits and the second group of information bits may comprise only the HARQ-ACK bit(s) or the CSI bit(s), and the other comprises both the HARQ-ACK bit(s) and the CSI bit(s). Moreover, the first group of information bits and the second group of information bits may respectively comprise one or more bits of the first type of information and one or more bits of the second type of information.

In the blocks 120 and 130, the first group of information bits and the second group of information bits are respectively encoded by the code vectors selected from the RM(32, n11+n12) vector set and the code vectors selected from the RM(32, n21+n22) vector set to respectively generate 32-bit code words CW1 and CW2.

In the blocks 140 and 150, the 32-bit code words CW1 and CW2 are respectively punctured to 24-bit code words CWT1 and CWT2.

In the block 160, the two 24-bit code words CWT1 and CWT2 are concatenated to generate a 48-bit code word CW48. The 48-bit code word CW48 is further processed by interleaving, constellation mapping, discrete Fourier transformation, inverse fast Fourier transformation, etc. to produce the PUCCH format 3 packet (not shown in FIG. 1).

In the embodiment in FIG. 1, the Reed-Muller encoding operations in FIG. 1 is effectively encoding the information bits with the code vectors selected from the RM(24,N) vector set, which is simplified from the RM(32, N) vector set. For example, according to the operations in the blocks 120 and 140, the first group of information bits is effectively encoded with the (n11+n12) code vectors selected from the RM(24,n11+n12) vector set. Moreover, according to the operations in the blocks 130 and 150, the second group of information bits is effectively encoded with the (n21+n22) code vectors selected from the RM(24,n21+n22) vector set. The Hamming distances of the code vectors in the RM(24, N) vector set are not as optimal as the Hamming distances of the code vectors in the original RM(32, N) vector set disclosed in the 3GPP technical specification.

Figure 2:
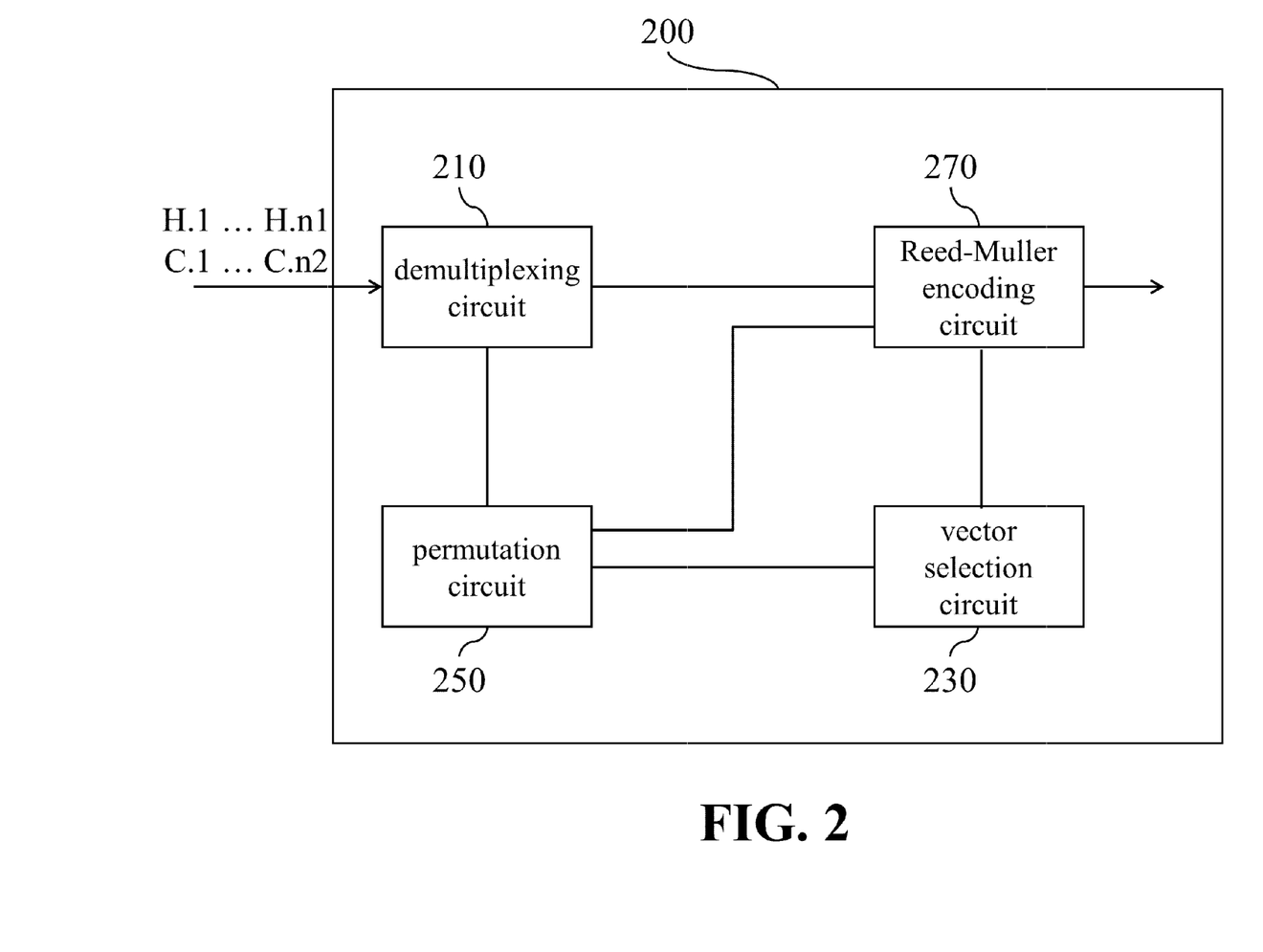
FIG. 2 shows a simplified functional block diagram of a communication device according to one embodiment of the present disclosure.
Figure 3:
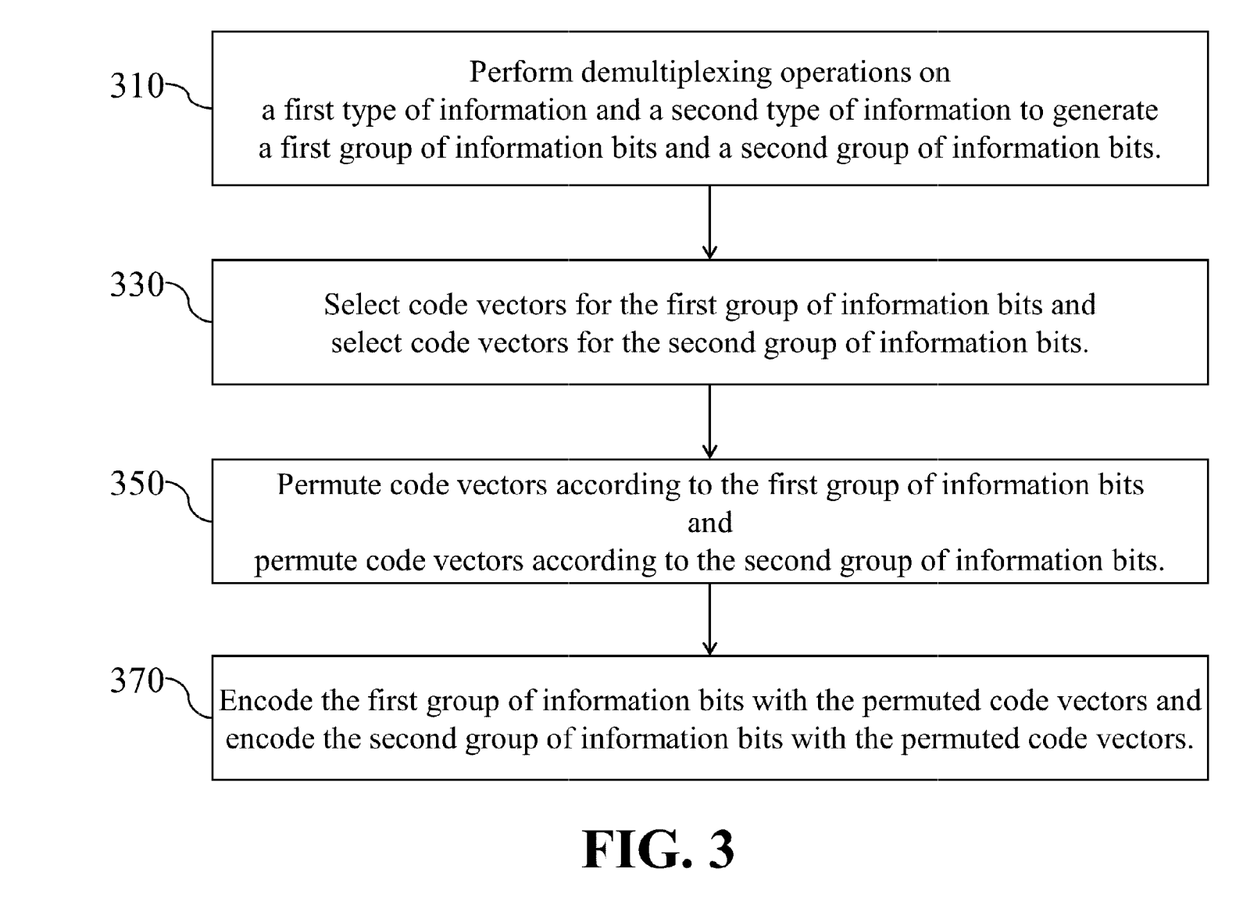
FIG. 3 shows a simplified flowchart of a communication method according to one embodiment of the present disclosure.

FIG. 2 shows a simplified functional block diagram of a communication device 200 according to one embodiment of the present disclosure. The communication device 200 comprises a demultiplexing circuit 210, a vector selection circuit 230, a permutation circuit 250 and a Reed-Muller encoding circuit 270. For the purposes of conciseness and clear explanation, other components and connections are not shown in FIG. 2. FIG. 3 shows a simplified flowchart of a communication method according to one embodiment of the present disclosure. The operations of the communication device 200 are further explained below with FIGS. 1, 2 and 3.

In the operation 310, the demultiplexing circuit 210 performs the demultiplexing operations as shown in the block 110 in FIG. 1. A first type of information (e.g., the HARQ-ACK bits H.1~H.n1 in this embodiment) and a second type of information (e.g., the CSI bits C.1~C.n2 in this embodiment) are demultiplexed by the demultiplexing circuit 210 according to a predetermined demultiplexing rule. For example, the odd bits of the first type of information and the odd bits of the second type of information are demultiplexed by the demultiplexed circuit 210 to generate a first group of information bits. The rest of the bits of the first type of information and the rest of the bits of the second type of information are demultiplexed to generate a second group of information bits. In this embodiment, a joint coding scheme is adopted. Therefore, the first group of information bits and the second group of information bits may respectively comprise one or more bits of the first type of information and one or more bits of the second type of information.

In this embodiment, the first group of information bits comprises the HARQ-ACK bits Ha.1~Ha.n11 and the CSI bits Ca.1~Ca.n12, and the second group of information bits comprises the HARQ-ACK bits Hb.1~Hb.n21 and the CSI bits Cb.1~Cb.n22. Moreover, the error rate requirement of the first type of information (e.g., BER less than 0.01 for the HARQ-ACK bits) is higher than the error rate requirement of the second type of information (e.g., BER less than 0.1 for some CSI bits).

In other embodiments, the method in FIG. 3 and other suitable encoding scheme(s) may cooperate to provide a better protection. For example, the repetition encoding operations may be performed before or after the demultiplexing operations. Thus, the first group of information bits comprises the repetition encoded output of the HARQ-ACK bits Ha.1~Ha.n11 and the repetition encoded output of the CSI bits Ca.1~Ca.n12. The second group of information bits comprises the repetition encoded output of the HARQ-ACK bits Hb.1~Hb.n21 and the repetition encoded output of the CSI bits Cb.1~Cb.n22. The additional encoding operations may also be performed only on part of the bits, e.g. on the more important bits. For example, the first group of information bits may comprise the repetition encoded output of the HARQ-ACK bits Ha.1~Ha.n11 and the CSI bits Ca.1~Ca.n12 (not repetition encoded).

In the operation 330, the vector selection circuit 230 selects (n11+n12) code vectors from the RM(24, n11+n12) vector set, and selects (n21+n22) code vectors from the RM(24, n21+n22) vector set.

In the operation 350, the permutation circuit 250 permutes the (n11+n12) code vectors according to the bit(s) of the first type of information and the bit(s) of the second type of information of the first group of information bits, and permutes the (n21+n22) code vectors according to the bit(s) of the first type of information and the bit(s) of the second type of information of the second group of information bits.

In the operation 370, the Reed-Muller encoding circuit 270 encodes the first group of information bits Ha.1~Ha.n11 and Ca.1~Ca.n12 with the permuted (n11+n12) code vectors, and encodes the second group of information bits Hb.1~Hb.n21 and Cb.1~Cb.n22 with the permuted (n21+n22) code vectors.

In the operation 330 above, the vector selection circuit 230 may selects the code vectors from the RM(24,N) vector set according to any suitable rule. Accordingly, in the operation 350 above, the permutation circuit 250 permutes the code vectors so that the code vectors with larger Hamming distance may be applied to the bits of the first type of information (which has a higher error rate requirement).

In one embodiment, the vector selection circuit 230 selects (n11+n12) code vectors from the RM(24, n11+n12) vector set so as to maximize the minimum Hamming distance of the selected (n11+n12) code vectors. Afterward, the vector selection circuit 230 selects n11 code vectors from the previously selected (n11+n12) code vectors for the n11 bits of the first type of information so as to maximize the minimum Hamming distance of the selected n11 code vectors. The permutation circuit 250 permutes the (n11+n12) code vectors so that the selected n11 code vectors may be applied to the n11 bits of the first type of information of the first group of information bits, and the remaining n12 code vectors may be applied to the n12 bits of the second type of information of the first group of information bits.

Moreover, the vector selection circuit 230 and the permutation circuit 250 may follow the same rule so as to encode the n21 bits of the first type of information of the second group of information bits with the selected n21 code vectors, and encode the n22 bits of the second type of information of the second group of information bits with the remaining n22 code vectors.

In another embodiment, the vector selection circuit 230 selects n11 code vectors from the RM(24, n11+n12) vector set so as to maximize the minimum Hamming distance of the n11 code vectors. Afterward, the vector selection circuit 230 selects n12 code vectors from the rest of the RM(24, n11+n12) vector set as to maximize the minimum Hamming distance of the selected n12 code vectors. The permutation circuit 250 permutes the selected n11 and n12 code vectors so that the selected n11 code vectors may be applied to the n11 bits of the first type of information of the first group of information bits, and the selected n12 code vectors may be applied to the n12 bits of the second type of information of the first group of information bits.

Moreover, the vector selection circuit 230 and the permutation circuit 250 may follow the same rule so as to encode the n21 bits of the first type of information of the second group of information bits with the selected n21 code vectors, and encode the n22 bits of the second type of information of the second group of information bits with the selected n22 code vectors.

Figure 4:
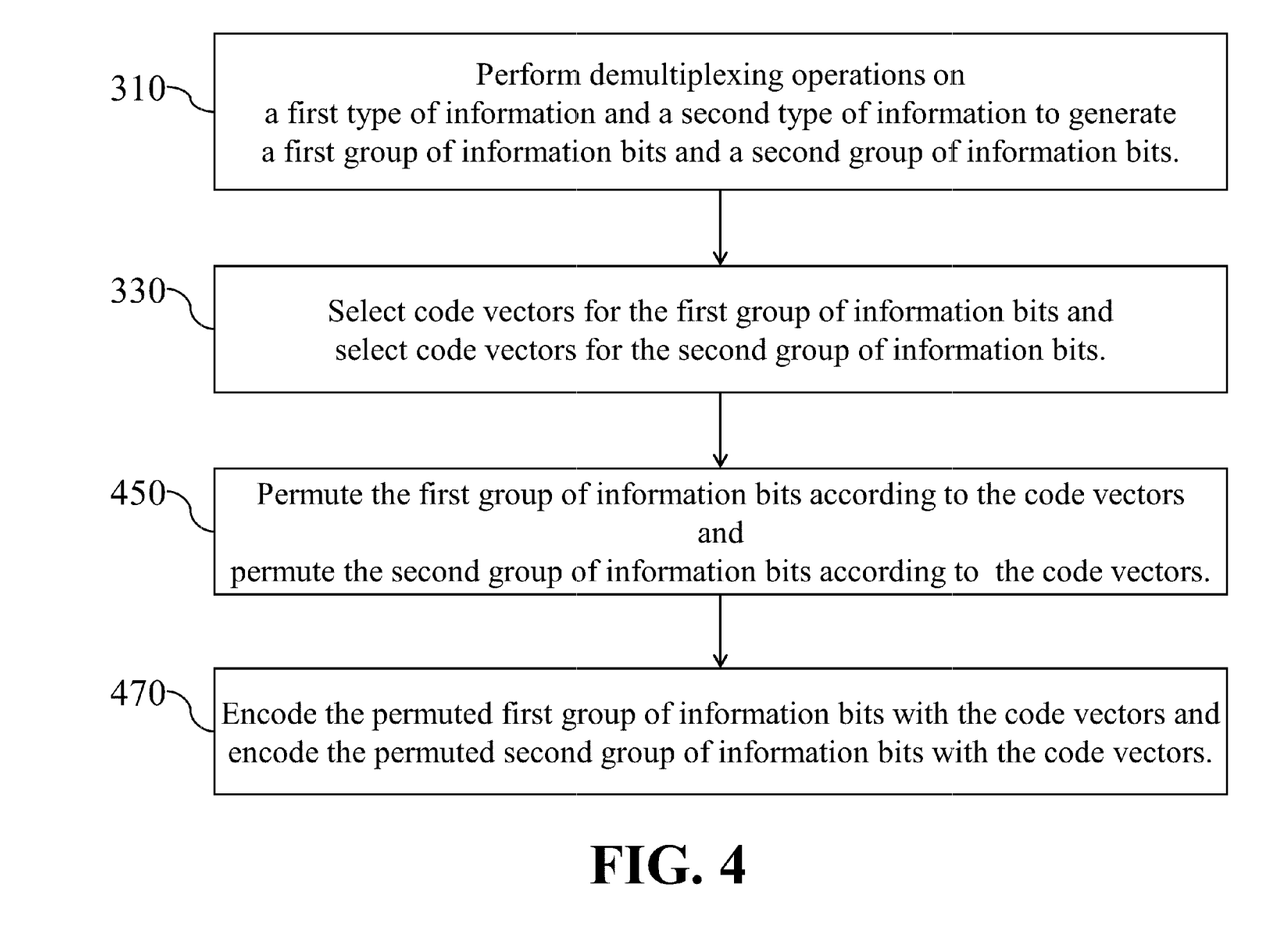
FIG. 4 shows a simplified flowchart of another communication method according to another embodiment of the present disclosure.

FIG. 4 shows a simplified flowchart of a communication method according to another embodiment of the present disclosure. The operations of the communication device 200 are further explained below with FIGS. 1, 2 and 4. The communication method in FIG. 4 comprises the operations 310, 330, 450 and 470. The operations 310 and 330 are the same as or similar to the embodiment in FIG. 3 above, and are not repeated for the purpose of conciseness.

In the operation 450, the permutation circuit 250 permutes the n11 bits and the n12 bits of the first group of information bits according to the selected (n11+n12) code vectors, and permutes the n21 bits and n22 bits of the second group of information bits according to the selected (n21+n22) code vectors.

In the operation 470, the Reed-Muller encoding circuit 270 encodes the permuted first group of information bits Ha.1~Ha.n11 and Ca.1~Ca.n12 with the (n11+n12) code vectors, and encodes the permuted second group of information bits Hb.1~Hb.n21 and Cb.1~Cb.n22 with the (n21+n22) code vectors.

In the operation 330 in FIG. 4, the vector selection circuit 230 may also selects the code vectors from the RM(24,N) vector set according to any suitable rule. Accordingly, in the operation 450 above, the permutation circuit 250 permutes the information bits so that the code vectors with larger Hamming distance may be applied to the first type of information (which has a higher error rate requirement).

In one embodiment, the vector selection circuit 230 selects (n11+n12) code vectors from the RM(24, n11+n12) vector set so as to maximize the minimum Hamming distance of the selected (n11+n12) code vectors. Afterward, the vector selection circuit 230 selects n11 code vectors from the previously selected (n11+n12) code vectors for the n11 bits of the first type of information so as to maximize the minimum Hamming distance of the selected n11 code vectors. The permutation circuit 250 permutes the n11 bits and the n12 bits of the first group of information bits so that the selected n11 code vectors may be applied to the n11 bits of the first type of information of the first group of information bits, and the remaining n12 code vectors may be applied to the n12 bits of the second type of information of the first group of information bits.

Moreover, the vector selection circuit 230 and the permutation circuit 250 may follow the same rule so as to encode the n21 bits of the first type of information of the second group of information bits with the selected n21 code vectors, and encode the n22 bits of the second type of information of the second group of information bits with the remaining n22 code vectors.

In another embodiment, the vector selection circuit 230 selects n11 code vectors from the RM(24, n11+n12) vector set so as to maximize the minimum Hamming distance of the selected n11 code vectors. Afterward, the vector selection circuit 230 selects n12 code vectors from the rest of the RM(24, n11+n12) vector set as to maximize the minimum Hamming distance of the selected n12 code vectors. The permutation circuit 250 permutes the n11 bits and the n12 bits of the first group of information bits so that the selected n11 code vectors may be applied to the n11 bits of the first type of information of the first group of information bits, and the selected n12 code vectors may be applied to the n12 bits of the second type of information of the first group of information bits.

Moreover, the vector selection circuit 230 and the permutation circuit 250 may follow the same rule so as to encode the n21 bits of the first type of information of the second group of information bits with the selected n21 code vectors, and encode the n22 bits of the second type of information of the second group of information bits with the selected n22 code vectors.

In the embodiments above, the vector selection circuit 230 may have more than one choice when selecting the n11, n21 and (n11+n12) code vectors, e.g., multiple sets of code vectors possess the same minimum Hamming distance. The vector selection circuit 230 may randomly select one of the multiple choices or select according to a predetermined rule. For example, the vector selection circuit 230 may select the set of code vectors whose second smallest Hamming distance is largest among the multiple sets of code vectors.

The above embodiments may also be applicable when there are more than two type of information, and still may provide different levels of protection according to the importance of the information.

The demultiplexing circuit 210, the vector selection circuit 230, the permutation circuit 250 and the Reed-Muller encoding circuit 270 may be respectively realized with specifically designed integrated circuit elements, discrete circuit elements, digital signal processors, generic microprocessors, etc. Moreover, one functional block in the drawings may be realized with multiple circuit elements and multiple function blocks may also be realized with one circuit element. For example, the Reed-Muller encoding circuit 270 may comprise two encoding circuits for simultaneously encoding the first group of information bits and the second group of information bits.

In the drawings, the size and relative sizes of some elements may be exaggerated or simplified for clarity. Accordingly, unless the context clearly specifies, the shape, size, relative size, and relative position of each element in the drawings are illustrated merely for clarity, and not intended to be used to restrict the claim scope.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The phrases "be coupled with," "couples with," and "coupling with" are intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

The term "and/or" may comprise any and all combinations of one or more of the associated listed items. In addition, the singular forms "a," "an," and "the" herein are intended to comprise the plural forms as well, unless the context clearly indicates otherwise.

Other embodiments of the invention will be apparent to those skilled in the art from consideration of the specification and practice of the invention disclosed herein. It is intended that the specification and examples be considered as exemplary only, with a true scope and spirit of the invention indicated by the following claims.

What is claimed is:

1. A communication device for uplink transmission with a first type of information and a second type of information, comprising:
   a demultiplexing circuit, configured to operably generate a first group of information bits and a second group of information bits according to the first type of information and the second type of information, wherein the first group of information bits comprises n11 bit(s) of the first type of information and n12 bit(s) of the second type of information; the second group of information bits comprises n21 bit(s) of the first type of information and n22 bit(s) of the second type of information;
   a vector selection circuit, configured to operably select (n11+n12) code vectors from a predetermined vector set, and select (n21+n22) code vectors from the predetermined vector set;
   a permutation circuit, configured to operably permute the (n11+n12) code vectors according to a first Hamming distance, and permute the (n21+n22) code vectors according to a second Hamming distance; and
   a Reed-Muller encoding circuit, configured to operably encode the first group of information bits with the permuted (n11+n12) code vectors, and encode the second group of information bits with the permuted (n21+n22) code vectors;
   wherein an error rate requirement of the first type of information is higher than an error rate requirement of the second type of information.

2. The communication device of claim 1, wherein the vector selection circuit selects (n11+n12) code vectors from the predetermined vector set so as to maximize the minimum Hamming distance of the (n11+n12) code vectors, and selects n11 code vectors from the (n11+n12) code vectors for the n11 bit(s) of the first type of information so as to maximize the minimum Hamming distance of the n11 code vectors; and the vector selection circuit selects (n21+n22) code vectors from the predetermined vector set so as to maximize the minimum Hamming distance of the (n21+n22) code vectors, and selects n21 code vectors from the (n21+n22) code vectors for the n21 bit(s) of the first type of information so as to maximize the minimum Hamming distance of the n21 code vectors.

3. The communication device of claim 1, wherein the vector selection circuit selects n11 code vectors from the predetermined vector set for the n11 bit(s) of the first type of information so as to maximize the minimum Hamming distance of the n11 code vectors before selecting n12 code vectors from the predetermined vector set for the n12 bit(s) of the second type of information, and selects n21 code vectors from the predetermined vector set for the n21 bit(s) of the first type of information so as to maximize the minimum Hamming distance of the n21 code vectors before selecting n22 code vectors from the predetermined vector set for the n22 bit(s) of the second type of information.

4. The communication device of claim 1, wherein the first type of information comprises one or more Hybrid Automatic Repeat Request Acknowledgement bits; the second type of information comprises one or more channel state information bits; and the predetermined vector set is a RM(24,N) vector set simplified from a RM(32,N) vector set.

5. The communication device of claim 1, wherein the first group of information bits comprises at least one of a repetition encoded output of the n11 bit(s) of the first type of information and a repetition encoded output of the n12 bit(s) of the second type of information; and the second group of information bits comprises at least one of a repetition encoded output of the n21 bit(s) of the first type of information and at least one of a repetition encoded output of the n22 bit(s) of the second type of information.

6. A communication device for uplink transmission with a first type of information and a second type of information, comprising:
   a demultiplexing circuit, configured to operably generate a first group of information bits and a second group of information bits according to the first type of information and the second type of information, wherein the first group of information bits comprises n11 bit(s) of the first type of information and n12 bit(s) of the second type of information; the second group of information bits comprises n21 bit(s) of the first type of information and n22 bit(s) of the second type of information;
   a vector selection circuit, configured to operably select (n11+n12) code vectors from a predetermined vector set, and select (n21+n22) code vectors from the predetermined vector set;
   a permutation circuit, configured to operably permute the n11 bit(s) and the n12 bit(s) of the first group of information bits according to a first Hamming distance, and permute the n21 bit(s) and n22 bit(s) of the second group of information bits according to a second Hamming distance; and
   a Reed-Muller encoding circuit, configured to operably encode the permuted first group of information bits with the (n11+n12) code vectors, and encode the permuted second group of information bits with the (n21+n22) code vectors;
   wherein an error rate requirement of the first type of information is higher than an error rate requirement of the second type of information.

7. The communication device of claim 6, wherein the vector selection circuit selects (n11+n12) code vectors from the predetermined vector set so as to maximize the minimum Hamming distance of the (n11+n12) code vectors, and selects n11 code vectors from the (n11+n12) code vectors for the n11 bit(s) of the first type of information so as to maximize the minimum Hamming distance of the n11 code vectors; and the vector selection circuit selects (n21+n22) code vectors from the predetermined vector set so as to maximize the minimum Hamming distance of the (n21+n22) code vectors, and selects n21 code vectors from the (n21+n22) code vectors for the n21 bit(s) of the first type of information so as to maximize the minimum Hamming distance of the n21 code vectors.

8. The communication device of claim 6, wherein the vector selection circuit selects n11 code vectors from the predetermined vector set for the n11 bit(s) of the first type of information so as to maximize the minimum Hamming distance of the n11 code vectors before selecting n12 code vectors from the predetermined vector set for the n12 bit(s) of the second type of information, and selects n21 code vectors from the predetermined vector set for the n21 bit(s) of the first type of information so as to maximize the minimum Hamming distance of the n21 code vectors before selecting n22 code vectors from the predetermined vector set for the n22 bit(s) of the second type of information.

9. The communication device of claim 6, wherein the first type of information comprises one or more Hybrid Automatic Repeat Request Acknowledgement bits; the second type of information comprises one or more channel state information bits; and the predetermined vector set is a RM(24,N) vector set simplified from a RM(32,N) vector set.

10. The communication device of claim 6, wherein the first group of information bits comprises at least one of a repetition encoded output of the n11 bit(s) of the first type of information and a repetition encoded output of the n12 bit(s) of the second type of information; and the second group of information bits comprises at least one of a repetition encoded output of the n21 bit(s) of the first type of information and at least one of a repetition encoded output of the n22 bit(s) of the second type of information.

11. A method for uplink transmission with a first type of information and a second type of information, comprising:
generating a first group of information bits and a second group of information bits according to the first type of information and the second type of information, wherein the first group of information bits comprises n11 bit(s) of the first type of information and n12 bit(s) of the second type of information; the second group of information bits comprises n21 bit(s) of the first type of information and n22 bit(s) of the second type of information;
selecting (n11+n12) code vectors from a predetermined vector set, and selecting (n21+n22) code vectors from the predetermined vector set;
permuting the (n11+n12) code vectors according to a first Hamming distance, and permuting the (n21+n22) code vectors according to a second Hamming distance; and
encoding the first group of information bits with the permuted (n11+n12) code vectors, and encoding the second group of information bits with the permuted (n21+n22) code vectors;
wherein an error rate requirement of the first type of information is higher than an error rate requirement of the second type of information.

12. The method of claim 11, further comprising:
selecting (n11+n12) code vectors from the predetermined vector set so as to maximize the minimum Hamming distance of the (n11+n12) code vectors, and selecting n11 code vectors from the (n11+n12) code vectors for the n11 bit(s) of the first type of information so as to maximize the minimum Hamming distance of the n11 code vectors; and
selecting (n21+n22) code vectors from the predetermined vector set so as to maximize the minimum Hamming distance of the (n21+n22) code vectors, and selecting n21 code vectors from the (n21+n22) code vectors for the n21 bit(s) of the first type of information so as to maximize the minimum Hamming distance of the n21 code vectors.

13. The method of claim 11, further comprising:
selecting n11 code vectors from the predetermined vector set for the n11 bit(s) of the first type of information so as to maximize the minimum Hamming distance of the n11 code vectors before selecting n12 code vectors from the predetermined vector set for the n12 bit(s) of the second type of information; and
selecting n21 code vectors from the predetermined vector set for the n21 bit(s) of the first type of information so as to maximize the minimum Hamming distance of the n21 code vectors before selecting n22 code vectors from the predetermined vector set for the n22 bit(s) of the second type of information.

14. The method of claim 11, wherein the first type of information comprises one or more Hybrid Automatic Repeat Request Acknowledgement bits;
the second type of information comprises one or more channel state information bits; and the predetermined vector set is a RM(24,N) vector set simplified from a RM(32,N) vector set.

15. The method of claim 11, wherein the first group of information bits comprises at least one of a repetition encoded output of the n11 bit(s) of the first type of information and a repetition encoded output of the n12 bit(s) of the second type of information; and the second group of information bits comprises at least one of a repetition encoded output of the n21 bit(s) of the first type of information and at least one of a repetition encoded output of the n22 bit(s) of the second type of information.

16. A method for uplink transmission with a first type of information and a second type of information, comprising:
generating a first group of information bits and a second group of information bits according to the first type of information and the second type of information, wherein the first group of information bits comprises n11 bit(s) of the first type of information and n12 bit(s) of the second type of information; the second group of information bits comprises n21 bit(s) of the first type of information and n22 bit(s) of the second type of information;
selecting (n11+n12) code vectors from a predetermined vector set, and selecting (n21+n22) code vectors from the predetermined vector set;
permuting the n11 bit(s) and the n12 bit(s) of the first group of information bits according to a first Hamming distance, and permuting the n21 bit(s) and n22 bit(s) of the second group of information bits according to a second Hamming distance; and
encoding the permuted first group of information bits with the (n11+n12) code vectors, and encoding the permuted second group of information bits with the (n21+n22) code vectors;
wherein an error rate requirement of the first type of information is higher than an error rate requirement of the second type of information.

17. The method of claim 16, further comprising:
selecting (n11+n12) code vectors from the predetermined vector set so as to maximize the minimum Hamming distance of the (n11+n12) code vectors, and selecting n11 code vectors from the (n11+n12) code vectors for the n11 bit(s) of the first type of information so as to maximize the minimum Hamming distance of the n11 code vectors; and
selecting (n21+n22) code vectors from the predetermined vector set so as to maximize the minimum Hamming distance of the (n21+n22) code vectors, and selecting n21 code vectors from the (n21+n22) code vectors for the n21 bit(s) of the first type of information so as to maximize the minimum Hamming distance of the n21 code vectors.

18. The method of claim 16, further comprising:
selecting n11 code vectors from the predetermined vector set for the n11 bit(s) of the first type of information so as to maximize the minimum Hamming distance of the n11 code vectors before selecting n12 code vectors from the predetermined vector set for the n12 bit(s) of the second type of information; and
selecting n21 code vectors from the predetermined vector set for the n21 bit(s) of the first type of information so as to maximize the minimum Hamming distance of the n21 code vectors before selecting n22 code vectors from the predetermined vector set for the n22 bit(s) of the second type of information.

19. The method of claim 16, wherein the first type of information comprises one or more Hybrid Automatic Repeat Request Acknowledgement bits; the second type of information comprises one or more channel state information bits; and the predetermined vector set is a RM(24,N) vector set simplified from a RM(32,N) vector set.

20. The method of claim 16, wherein the first group of information bits comprises at least one of a repetition encoded output of the n11 bit(s) of the first type of information and a repetition encoded output of the n12 bit(s) of the second type of information; and the second group of information bits comprises at least one of a repetition encoded output of the n21 bit(s) of the first type of information and at least one of a repetition encoded output of the n22 bit(s) of the second type of information.

\* \* \* \* \*